US005729225A

United States Patent [19]

Ledzius

[11] Patent Number: 5,729,225

[45] Date of Patent: Mar. 17, 1998

[54] METHOD AND APPARATUS FOR ASYNCHRONOUS DIGITAL MIXING

[75] Inventor: Robert C. Ledzius, Austin, Tex.

[73] Assignee: Motorola, Inc., Schaumburg, Ill.

[21] Appl. No.: 710,792

[22] Filed: Sep. 23, 1996

[51] Int. Cl.[6] .......... H03M 7/00

[52] U.S. Cl. .......... 341/61

[58] Field of Search .......... 341/61; 370/91; 364/270.5, 270.9

[56] References Cited

U.S. PATENT DOCUMENTS

| | | | |
|---|---|---|---|
| 4,213,094 | 7/1980 | Wood | 370/12 |
| 5,323,157 | 6/1994 | Ledzius et al. | 341/143 |
| 5,339,079 | 8/1994 | Ledzius et al. | 341/144 |
| 5,357,252 | 10/1994 | Ledzius et al. | 341/143 |
| 5,504,751 | 4/1996 | Ledzius et al. | 370/100.1 |

OTHER PUBLICATIONS

Analog Devices, Inc., "Serial-Port 16-Bit SoundComm Codec AD1843," 1996, pp. 1-11.

Analog Devices, Inc. et al., "Audio Codec '97 Component Specification, Revision 1.02," May 28, 1996, pp. 1-48.

*Primary Examiner*—Brian K. Young

*Attorney, Agent, or Firm*—Daniel D. Hill; J. Gustav Larson

[57] ABSTRACT

An asynchronous digital mixer (20) receives digitally sampled audio signal data at different unrelated asynchronous sampling rates. The audio data is then edge synchronized and mixed using a summing element (28) and an oversampled sigma delta digital modulator (42), where a single bit output of the digital modulator (42) can be output as an analog signal with the use of a smoothing filter (46), or further decimated using a digital decimation filter (44) for storage on a digital media. Additionally, analog audio signals can be converted and mixed digitally within the system using an analog interface (35) without having to decimate and filter each analog input signal individually.

13 Claims, 2 Drawing Sheets

20

METHOD AND APPARATUS FOR ASYNCHRONOUS DIGITAL MIXING

FIELD OF THE INVENTION

This invention relates generally to mixed signal processing, and more particularly, to a method and apparatus for mixing asynchronous digital signals.

BACKGROUND OF THE INVENTION

Currently, mixing of two or more digitally sampled signals is done in one of two ways. The most common approach, because of cost, is to convert all of the signals to be mixed to analog representations and then mix the signals in the analog domain. The result of the mixing is then converted back to a desired digital sampled form using high performance digital to analog converters. A problem with converting the signal to an analog domain and then converting back to digital domain is that inaccuracies and noise may be introduced when mixing in the analog domain. A significant amount of analog smoothing filter components are needed to correct the possible performance degradation. The amount of analog smoothing is a significant problem which needs to be addressed using this method.

Another prior art approach uses digital sample rate phase converters to first up-sample and then decimate down to a common sampling frequency so that digital sum mixing can take place. The circuitry required to do this function is generally very large and costly to implement, however, this approach can provide higher performance than the previously described approach of mixing in the analog domain. Therefore, the need exists to sum asynchronous digitally sampled inputs without having to utilize expensive sample rate phase converters.

DESCRIPTION OF A PREFERRED EMBODIMENT

Generally, the present invention provides an asynchronous digital mixer that includes apparatus for inputting digitally sampled audio signal data at different unrelated asynchronous sampling rates. The digitally sampled data sources are then edge synchronized and mixed using a summing network and an oversampled sigma-delta digital modulator, where the single bit output of the digital modulator can be output as an analog signal with the use of a smoothing filter or further decimated for storage on a digital media.

Additionally, analog audio signals can be converted and mixed digitally within the system without having to decimate and filter each analog input signal individually.

The asynchronous digital mixer provides for low cost digital mixing from multiple sources without the use of expensive individual sample phase rate converters, although mixing is still done digitally where noise elements can be controlled and kept from degradating the perceived signal quality.

Figure 1:
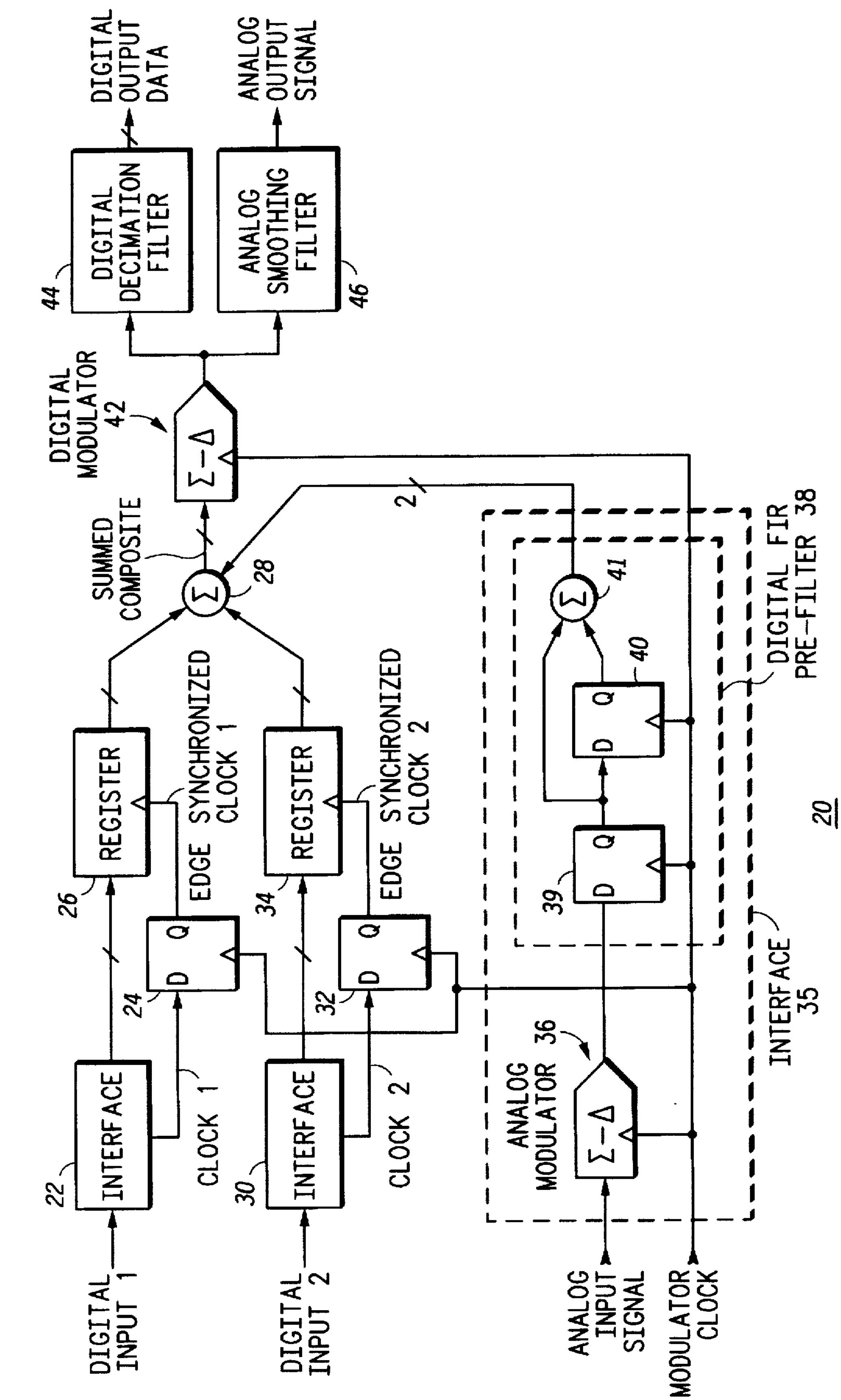
FIG. 1 illustrates, in functional block diagram form, an asynchronous digital mixer in accordance with one embodiment of the present invention.

Specifically, the present invention can be described with reference to FIGS. 1 and 2. FIG. 1 illustrates, in functional block diagram form, an asynchronous digital mixer in accordance with one embodiment of the present invention. Asynchronous digital mixer 20 includes digital interfaces 22 and 30, analog interface 35, flip-flops 24 and 32, registers 26 and 34, summing element 28, digital modulator 42, digital decimation filter 44, analog smoothing filter 46, analog modulator 36, digital FIR (finite impulse response) pre-filter 38. Digital FIR pre-filter 38 includes flip flops 39 and 40, and summing element 41. Analog interface 35 includes the analog modulator 36 and the digital FIR pre-filter 38.

Digital interface 22 includes a serial input terminal for receiving a serial digital input signal labeled "DIGITAL INPUT 1" and a plurality of output terminals for providing, based on system requirements, an optionally interpolated parallel digital output representation of DIGITAL INPUT 1. Also, interface 22 includes an output terminal for providing a reference clock signal labeled "CLOCK 1". Register 26 has input terminals connected to the plurality of output terminals from interface 22, a plurality of output terminals connected to input terminals of summing element 28, and a clock input terminal for receiving an edge synchronized clock signal from a Q output terminal of flip-flop 24. Flip-flop 24 is a D-type flip-flop and has an input terminal labeled "D" for receiving the clock signal labeled "CLOCK 1" and an output terminal labeled "Q" for providing the edge synchronized CLOCK 1 to a clock input terminal of register 26.

Likewise, digital interface 30 has an input terminal for receiving a serial digital input signal labeled "DIGITAL INPUT 2", a plurality of output terminals for providing an optionally interpolated parallel digital representation of the DIGITAL INPUT 2, and an output terminal for providing a reference clock signal labeled "CLOCK 2". A flip flop 32 is a D-type flip-flop and has a D terminal for receiving the clock signal CLOCK 2 from interface 30 and an output terminal labeled "Q" for providing an edge synchronized clock signal representative of CLOCK 2 to a clock input of register 34. Output terminals of register 34 are provided to input terminals of summing element 28.

Analog modulator 36 has an input terminal for receiving an analog input signal, a clock input terminal for receiving an oversampled modulator clock signal labeled "MODULATOR CLOCK", and an output terminal. The output terminal of analog modulator 36 is coupled to an input terminal of the digital FIR pre-filter 38. Analog modulator 36, digital modulator 42, and each of flip-flops 24, 33, 39 and 40 receive the oversampled modulator clock signal MODULATOR CLOCK. The digital modulator 42 is used to convert the summed composite signal from summing element 28 to a single bit stream output at the modulator clock rate, and in a preferred embodiment, is a single bit modulator.

In operation, DIGITAL INPUT 1 and DIGITAL INPUT 2 are serial input signals sampled at different clock rates and are asynchronous to each other. Digital interface 22 and digital interface 30 may be any kind of digital audio interface for transferring periodic digital samples which represent an analog audio signal, such as an interface for extracting data in an AES/EBU transmission format. Also, digital interfaces 22 and 30 may be another type of interface, such as an $I^2S$ standard interface, an analog-to-digital modulator with a minimum filter, or a parallel interface. An example interface is taught in U.S. Pat. No. 5,504,751.

When DIGITAL INPUT 1 and DIGITAL INPUT 2 are sampled at different clock rates, flip-flops 24 and 32 are used to edge synchronize the corresponding reference clock signals, either CLOCK 1 or CLOCK 2 to the modulator clock. The summing element 28 can be used to sum any two of the input signals or all of the input signals to provide a summed composite of the data signals corresponding to either DIGITAL INPUT 1, DIGITAL INPUT 2, or the analog input signal. Note that for clarity, only three signals are being summed in the illustrated embodiment. However, in other embodiments, a different number than three signals may be summed together. This summed composite is illustrated in FIG. 2 and is provided to the input terminal of digital modulator 42.

The output of digital modulator 42 may be provided as an input to either or both of the digital decimation filter 44 or as an input to an analog smoothing filter 46. Digital decimation filter 44 provides an output signal labeled "DIGITAL OUTPUT DATA" and analog smoothing filter 46 provides as an output an "ANALOG OUTPUT SIGNAL". As used in this application, the input signals are asynchronous when an edge of one clock signal is not related to an edge of a second clock signal. Likewise, two signals are synchronous to each other when an edge of one of the clocks is directly obtained from the edge of another clock. Two signals are edge synchronous when an edge of a first asynchronous clock is resampled to an edge of a second significantly higher frequency asynchronous clock. Therefore, the average frequency of the edge synchronous clock is unchanged, but the instantaneous period of any single period will change depending on the timing of the edge of the higher frequency clock used to edge synchronize the first lower frequency asynchronous clock.

Figure 2:
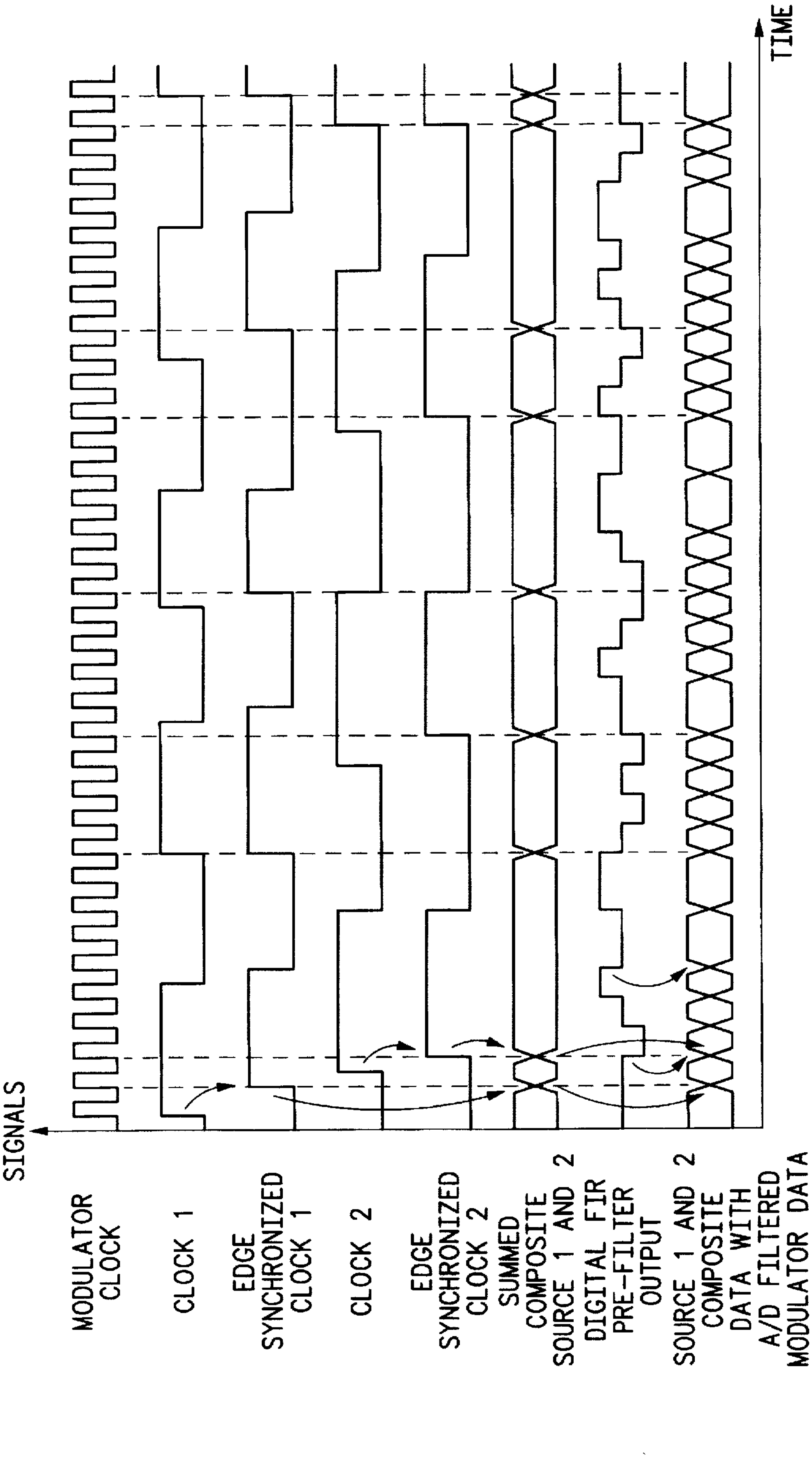
FIG. 2 illustrates a timing diagram of various signals of the asynchronous digital mixer of FIG. 1.

FIG. 2 illustrates a timing diagram of various signals of the asynchronous digital mixer 20 of FIG. 1. In FIG. 2, clock signal MODULATOR CLOCK is illustrated at a significantly higher frequency than digital input signals CLOCK 1 and CLOCK 2. Digital input signal CLOCK 1 is asynchronous to CLOCK 2, and both are asynchronous to MODULATOR CLOCK. Note that either of the digital input signals may also be synchronous to each other and synchronous to the MODULATOR CLOCK. As shown in FIG. 1, CLOCK 1 is edge-synchronized to MODULATOR CLOCK using flip-flop 24. CLOCK 2 is edge-synchronized to MODULATOR CLOCK using flip-flop 32. Illustrated in FIG. 2 is a composite sum of DIGITAL INPUT 1 and DIGITAL INPUT 2 in a wave form labeled "COMPOSITE SUM OF SOURCE 1 and 2". FIG. 2 also illustrates an output of summing element 28 for a summed composite of the data corresponding to only CLOCK 1 and CLOCK 2 after CLOCK 1 and the CLOCK 2 are edge synchronized. Shown at the bottom of FIG. 2 is a composite of data corresponding to CLOCK 1, CLOCK 2, and the minimally filtered digital representation (DIGITAL FIR PRE-FILTER OUTPUT) of the ANALOG INPUT SIGNAL.

Digital decimation filter 44 may be used, for example, to convert the output of digital modulator 42 to a form that could be stored on, for example, a hard drive of a computer system. Analog smoothing filter 46 may be used, for example, to provide an analog output signal to a loud speaker or to a magnetic recording medium such as magnetic tape. Analog modulator 36 may be implemented, as illustrated in FIG. 1, as a conventional sigma-delta analog-to-digital converter. Digital FIR pre-filter 38 may be implemented simply as a two tap FIR filter that consists of two flip-flops and a single bit adder as illustrated in FIG. 1. However, other types of digital FIR filters may be used. Note that analog modulator 36 operates synchronously with digital modulator 42. In the illustrated embodiment, an over sampling ratio of at least 128× is needed and at least 256× is preferred for digital modulator 42 for hi-fidelity audio applications. However, other over sampling ratios may be used in other applications.

Analog modulator 36 and digital modulator 42 are each conventional sigma-delta modulators of the same order. Digital FIR pre-filter 38 is needed because the out of band shaped noise from analog modulator 36 will saturate the dynamic range of the digital modulator if the single bit noise shaped analog input signal is not partially filtered before summing it using summing element 28, and then introducing it to digital modulator 42. Note that, although not illustrated in FIG. 1, a way to adjust the gain of the signals provided by interfaces 22, 30, and 35 would be included to prevent saturation of digital modulator 42 when various signals are summed using summing element 28.

Asynchronous digital mixer 20 would be appropriate for use in an area of personal computer based multimedia systems where there is a need to mix multiple asynchronous digital sources and provide those into one digitally sampled source. These sources may be either analog or digital. The digital input signals can be of different asynchronous sampling frequencies and the analog sources can be sampled synchronously. Use of the asynchronous digital mixer 20 as illustrated in FIG. 1 allows digital mixing of multiple asynchronous signals to be done without the use of expensive sample rate phase conversion filters and also without the need to convert all signals to be mixed into their analog form for summing and then converting them to some other sampling rate. Asynchronous digital mixer 20 only requires a summing adder at an input of an oversampled sigma-delta converter, and as a result, is easier to implement and less expensive than previous asynchronous digital mixers. Also, asynchronous digital mixer 20 will have less perceptible performance degradation than current analog mixing. Additionally, the signal-to-noise ratio for small signals can be improved drastically over existing methods since the modulator clock can be from a quiet crystal based oscillator without the use of a phase locked loop (PLL) or intermediate analog circuitry.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. An apparatus for mixing asynchronous digital audio signals, the apparatus comprising:

a first summing element coupled to receive a first digital audio signal having a first sampling rate, and a second digital audio signal having a second sampling rate, and for providing a composite digital audio signal, wherein the first digital audio signal and the second digital audio signal are edge synchronized to a modulator clock having a modulator frequency at a rate higher than the first sampling rate and the second sampling rate, and wherein the first digital audio signal and the second digital audio signal are generated from sources asynchronous to each other and asynchronous to the modulator clock; and a digital modulator, coupled to receive the composite digital audio signal, the digital modulator for providing an over-sampled digital audio output signal sampled at the modulator frequency sampling rate.

2. The apparatus of claim 1, wherein either of the first or second digital audio signal sampling rates are characterized as being synchronous to the modulator clock.

3. The apparatus of claim 1, further comprising:

an analog-to-digital converter for receiving an analog signal and providing the first digital audio signal, wherein the first digital audio signal has a sampling rate substantially equal to the modulator clock.

4. The apparatus of claim 3, further comprising a digital finite impulse response filter, the digital finite impulse response filter comprising:

a first flip-flop having an input for receiving the first digital audio signal, and an output;

a second flip-flop having an input coupled to the output of the first flip-flop, and an output; and a second summing element having first and second inputs coupled to the outputs of the first and second flip-flops, respectively, and an output coupled to the first summing element.

5. The apparatus of claim 1, further comprising:

a first interface portion for providing the first digital audio signal, the first interface portion comprising a data input for receiving a first digital audio input signal, and providing the first digital audio signal a first digital audio signal clock;

a first D-type flip-flop having a data input for receiving the first digital audio signal clock, a clock input for receiving the modulator clock, and a data output;

a first register having a data input operably coupled to receive the first digital audio signal, a clock input coupled to the data output of the first D-type flip-flop, and a first data output;

a second interface portion for providing the second digital audio signal, the second interface portion comprising a data input for receiving a second digital audio input signal, and providing the second digital audio signal and a second digital audio signal clock;

a second D-type flip-flop having a data input for receiving the second digital audio signal clock, a clock input for receiving the modulator clock, and a second data output;

a second register having a data input operably coupled to receive the second digital audio signal, a clock input coupled to the data output of the second D-type flip-flop, and a data output; and the first summing element having a first input coupled to the first data output, and a second input coupled to the second data output, and for providing an adder output signal corresponding to the composite digital audio signal.

6. The apparatus of claim 1, wherein the digital modulator further comprises a single bit modulator.

7. An apparatus for mixing asynchronous digital audio signals, the apparatus comprising:

a first interface portion for receiving a first serial digital signal having a first sampling rate, the first interface portion for providing corresponding first parallel digital signals having a second sampling rate;

a synchronization portion for receiving the first parallel digital signals and a modulator clock, and for providing first edge synchronized digital signals, wherein the first edge synchronized digital signals are edge synchronized to the modulator clock and having the second sampling rate;

a summing element coupled to receive the first edge synchronized digital signals and second edge synchronized digital signals having a third sampling rate, and in response, the summing element providing a composite digital output signal, wherein the first edge synchronized digital signals and the second edge synchronized digital signals are edge synchronized to the modulator clock, the modulator clock having a frequency that is relatively higher than both the second sampling rate and the third sampling rate; and a digital modulator having an input for receiving the composite digital output signal from the summing element, and providing a modulated digital signal, wherein the digital modulator operates at the third sampling rate.

8.The apparatus of claim 7 wherein the first sampling rate is equal to the second sampling rate.

9. The apparatus of claim 7 wherein the second sampling rate is interpolated from the first sampling rate and the first sampling rate is different than the second sampling rate.

10. The apparatus of claim 7 wherein the synchronization portion further comprises:

a register coupled to receive the first parallel digital signals; and a flip-flop coupled to receive a parallel digital signal clock corresponding to the first parallel digital signals, and the modulator clock, and for providing a edge synchronization clock, and the edge synchronization clock is a representation of the parallel digital signal clock where the parallel digital signal clock has edges that are shifted to corresponding edges of the reference clock to provide the edge synchronization clock.

11. The apparatus of claim 7 further comprising:

a digital decimation filter having an input for receiving the modulated digital signal and providing a digital output data, wherein the digital output data has a sampling rate less than the third sampling rate.

12. The apparatus of claim 7 further comprising:

an analog smoothing filter having an input for receiving the modulated digital signal and providing an analog output data.

13. A method of combining asynchronous digital audio signals, wherein the method comprises the steps of:

receiving a first digital audio signal;

receiving a second digital audio signal;

edge-synchronizing the first digital audio signal to a reference signal to provide a synchronized first digital audio signal, wherein the reference signal has a higher frequency than the first digital audio signal;

edge-synchronizing the second digital audio signal to a reference signal to provide a synchronized second digital audio signal, wherein the reference signal has a higher frequency than the first digital audio signal;

summing the synchronized first digital audio signal and the synchronized second digital audio signal to provide a combined audio signal; and modulating the combined audio signal at the higher frequency of the reference signal.

* * * * *